US012690283B2

(12) United States Patent
Baek et al.

(10) Patent No.: US 12,690,283 B2
(45) Date of Patent: Jul. 21, 2026

(54) IMAGE SENSOR

(71) Applicant: SAMSUNG ELECTRONICS CO., LTD., Suwon-si (KR)

(72) Inventors: Ingyu Baek, Suwon-si (KR); Kwansik Kim, Suwon-si (KR); Jungsan Kim, Suwon-si (KR); Taemin Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 377 days.

(21) Appl. No.: 18/380,795

(22) Filed: Oct. 17, 2023

(65) Prior Publication Data

US 2024/0222399 A1 Jul. 4, 2024

(30) Foreign Application Priority Data

Jan. 2, 2023 (KR) ........................ 10-2023-0000362

(51) Int. Cl.
H10F 39/00 (2025.01)
H10F 39/18 (2025.01)

(52) U.S. Cl.
CPC ......... H10F 39/802 (2025.01); H10F 39/182 (2025.01); H10F 39/807 (2025.01)

(58) Field of Classification Search
CPC ..... H10F 39/182; H10F 39/807; H10F 39/802
See application file for complete search history.

(56) References Cited

U.S. PATENT DOCUMENTS

| | | | |
|---|---|---|---|
| 7,589,365 B2 | 9/2009 | Rhodes | |
| 7,847,847 B2 | 12/2010 | Yaung et al. | |
| 8,917,341 B2 | 12/2014 | Sakano et al. | |
| 9,661,246 B2 | 5/2017 | Wakano et al. | |
| 9,881,954 B2 | 1/2018 | Takahashi et al. | |
| 2020/0058688 A1* | 2/2020 | Kwon | H10F 39/151 |
| 2020/0111831 A1* | 4/2020 | Choi | H10F 39/18 |
| 2020/0389608 A1* | 12/2020 | Baek | H04N 25/778 |
| 2021/0250529 A1 | 8/2021 | Baek et al. | |
| 2022/0052086 A1* | 2/2022 | Choi | H10F 39/811 |
| 2022/0199661 A1 | 6/2022 | Kurachi et al. | |

* cited by examiner

*Primary Examiner* — Steven M Page
(74) *Attorney, Agent, or Firm* — Sughrue Mion, PLLC

(57) ABSTRACT

An image sensor may include a substrate including pixels, a first transistor and a second transistor disposed on the substrate and spaced apart from each other, a first interlayer insulating layer covering the first transistor and the second transistor, a first lower electrode disposed in the first interlayer insulating layer and connected to an end portion of the first transistor, a first dielectric layer on the first lower electrode, a first upper electrode on the first dielectric layer, a second interlayer insulating layer covering the first upper electrode and the first interlayer insulating layer, and a first pillar provided to penetrate the second and first interlayer insulating layers and connected to an end portion of the second transistor.

18 Claims, 13 Drawing Sheets

FIG. 12

IMAGE SENSOR

CROSS-REFERENCE TO RELATED APPLICATIONS

This U.S. non-provisional patent application claims priority under 35 U.S.C. § 119 to Korean Patent Application No. 10-2023-0000362, filed on Jan. 2, 2023, in the Korean Intellectual Property Office, the entire contents of which are hereby incorporated by reference.

BACKGROUND

The present disclosure relates to an image sensor.

An image sensor is a semiconductor device converting an optical image to electric signals. The image sensor is classified into two types: a charge coupled device (CCD) type and a complementary metal-oxide-semiconductor (CMOS) type. The CMOS-type image sensor is called CIS for short. The CIS includes a plurality of pixels that are two-dimensionally arranged. Each of the pixels includes a photodiode (PD). The photodiode is used to convert an incident light to an electric signal.

The image sensor can be used as a main component in various devices, such as cameras, cellular phones, and cars. In order to provide a high-quality image to a user or to accurately represent a subject, it is necessary to improve a dynamic range of an image acquired by the image sensor. The dynamic range is a range, in which the brightness of an image can be displayed from a dark part to a bright part. Various methods have been suggested to produce a high dynamic range (HDR) image with an improved dynamic range.

SUMMARY

It is an aspect to provide a highly-integrated image sensor capable of obtaining high-quality images.

According to an aspect of one or more embodiments, an image sensor may include a substrate including a plurality of pixels; a first transistor and a second transistor disposed on the substrate, the first transistor spaced apart on the substrate from the second transistor; a first interlayer insulating layer covering the first transistor and the second transistor; a first lower electrode disposed in the first interlayer insulating layer and connected to an end portion of the first transistor; a first dielectric layer on the first lower electrode; a first upper electrode on the first dielectric layer; a second interlayer insulating layer covering the first upper electrode and the first interlayer insulating layer; and a first pillar provided to penetrate the second interlayer insulating layer and the first interlayer insulating layer, the first pillar being connected to an end portion of the second transistor, wherein the first dielectric layer comprises a material different from a material of the first interlayer insulating layer.

According to another aspect of one or more embodiments, an image sensor may include a substrate including a plurality of pixels; a transfer gate disposed on the substrate; a floating diffusion region beside the transfer gate; a first source follower gate connected to the floating diffusion region and disposed on the substrate; a first impurity region beside the first source follower gate; a first transistor connected to the first impurity region and a second transistor connected to the first impurity region; a first capacitor connected to an end portion of the first transistor; and a second capacitor connected to an end portion of the second transistor, wherein, when viewed in a plan view, an area of the second capacitor is different from an area of the first capacitor.

According to yet another aspect of one or more embodiments, an image sensor may include a substrate including a plurality of pixels; a device isolation portion disposed in the substrate to separate the plurality of pixels from each other; a transfer gate disposed on the substrate and in each of the plurality of pixels; a floating diffusion region beside the transfer gate; a first source follower gate connected to the floating diffusion region and disposed on the substrate; a first impurity region beside the first source follower gate; a first transistor, a second transistor, a third transistor, and a fourth transistor, each connected to the first impurity region; a first interlayer insulating layer covering the substrate, the first transistor, the second transistor, the third transistor, and the fourth transistor; a first capacitor connected to an end portion of the first transistor; a second capacitor connected to an end portion of the second transistor; a third capacitor connected to an end portion of the third transistor; and a fourth capacitor connected to an end portion of the fourth transistor, wherein the first capacitor, the second capacitor, the third capacitor and the fourth capacitor are located on the first interlayer insulating layer, a first one of the first capacitor, the second capacitor, the third capacitor and the fourth capacitor has a first capacitance, a second one of the first capacitor, the second capacitor, the third capacitor and the fourth capacitor has a second capacitance, and the first capacitance is 10 to $10^{10}$ times the second capacitance.

BRIEF DESCRIPTION OF THE DRAWINGS

FIG. 12 is a sectional view illustrating an image sensor according to some embodiments.

DETAILED DESCRIPTION

Various example embodiments will now be described more fully with reference to the accompanying drawings, in which example embodiments are shown.

Figure 1:
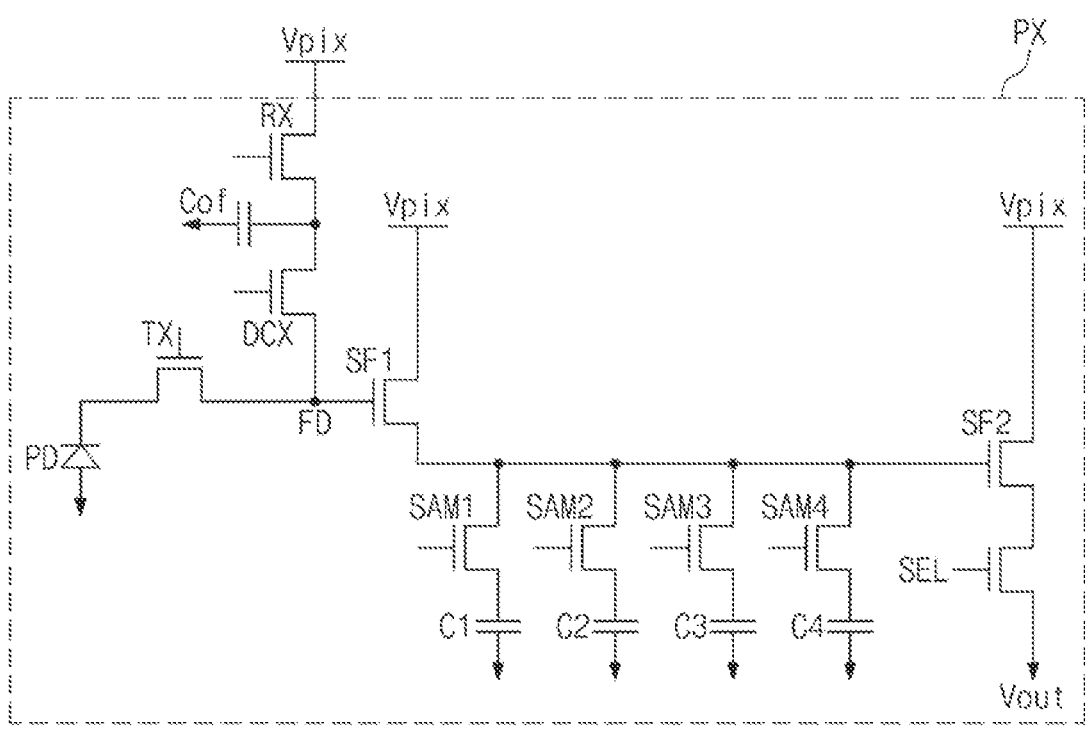
FIG. 1 is a circuit diagram illustrating an image sensor according to some embodiments.

FIG. 1 is a circuit diagram illustrating an image sensor according to some embodiments.

Referring to FIG. 1, each of pixels PX in an image sensor may include a photoelectric conversion part PD, a transfer transistor TX, a reset transistor RX, a first source follower transistor SF1 and a second source follower transistor SF2, a dual conversion transistor DCX, a first sampling transistor SAM1, a second sampling transistor SAM2, a third sampling transistor SAM3, a fourth sampling transistor SAM4, a selection transistor SEL, and a first capacitor C1, a second capacitor C2, a third capacitor C3, and a fourth capacitor C4.

The photoelectric conversion part PD may be a photodiode including an n-type impurity region and a p-type impurity region. A first terminal of the transfer transistor TX may be connected to the photoelectric conversion part PD. A second terminal of the transfer transistor TX may correspond to a floating diffusion region FD. The floating diffusion region FD may be connected to a first terminal of the dual conversion transistor DCX. A second terminal of the dual conversion transistor DCX may be connected to a first terminal of the reset transistor RX. A capacitor Cof may be disposed between the dual conversion transistor DCX and the reset transistor RX.

The floating diffusion region FD may be electrically connected to a gate of the first source follower transistor SF1. A first terminal of the first source follower transistor SF1 may be connected to first terminals of the first to fourth sampling transistors SAM1 to SAM4. Second terminals of the first to fourth sampling transistors SAM1 to SAM4 may be connected to the first to fourth capacitors C1 to C4, respectively. The first terminal of the first source follower transistor SF1 may be connected to a gate of the second source follower transistor SF2. The second source follower transistor SF2 may be connected to the selection transistor SEL.

A voltage level of the floating diffusion region FD may be determined depending on an electrostatic capacitance (hereinafter, capacitance) of the capacitor Cof and an amount of electric charges (e.g., electrons) provided from the transfer transistor TX. The reset transistor RX may be configured to reset the floating diffusion region FD. For example, when the dual conversion transistor DCX is in a turned-on state, the reset transistor RX may electrically connect the floating diffusion region FD to a power voltage Vpix, based on an electrical signal (e.g., a reset signal) applied to a reset gate. Depending on the reset signal, the power voltage Vpix may be applied to the floating diffusion region FD through the reset transistor RX, and in this case, electrons, which are stored in the floating diffusion region FD, may be removed or discharged. A conversion gain may be changed by turning on or off the dual conversion transistor DCX.

The first source follower transistor SF1 may output an output signal to the first to fourth sampling transistors SAM1 to SAM4 and the second source follower transistor SF2, based on the voltage level of the floating diffusion region FD. In low- and/or high-brightness operations, at least one of the first to fourth sampling transistors SAM1 to SAM4 may be turned-on to store the output signal in at least one of the first to fourth capacitors C1 to C4. The output signal, which are stored in the at least one of the first to fourth capacitors C1 to C4, may be transmitted to the gate of the second source follower transistor SF2 by turning on a corresponding one of the first to fourth sampling transistors SAM1 to SAM4. In this case, the output signal may be transferred to an output line Vout through the selection transistor SEL, depending on an electrical signal applied to a selection gate.

In the image sensor according to some embodiments, at least two of the first to fourth capacitors C1 to C4 may have different capacitances from each other. For this configuration, at least two of the first to fourth capacitors C1 to C4 may have structures or materials that are different from each other. For example, at least one of the first to fourth capacitors C1 to C4 may have a first capacitance, at least one of the others may have a second capacitance, and here, the first capacitance may be 10 to $10^{10}$ times the second capacitance. The capacitor with the first capacitance (i.e., the at least one of the first to fourth capacitors C1 to C4) may store an output data or signal obtained in a high-brightness operation. The capacitor with the second capacitance (e.g., the at least one of the others) may store an output data or signal obtained in a low-brightness operation.

In the image sensor according to some embodiments, the capacitors C1 to C4 with different capacitances may be disposed on each of the pixels PX, as described above. Accordingly, it may be possible to realize a high-quality image with an improved HDR property and to increase an integration density of the pixels.

Although FIG. 1 illustrates an example of the image sensor, in which the pixel PX is provided to include four sampling transistors (e.g., SAM1 to SAM4) and four capacitors (e.g., C1 to C4), the numbers of the sampling transistors and the capacitors are not limited to those in the illustrated example; for example, the pixel PX may be provided to include 2, 3, 5 or more sampling transistors and 2, 3, 5 or more capacitors. In addition, some of the pixels may be configured to share at least one of the sampling transistors and/or at least one of the capacitors.

Figure 2:
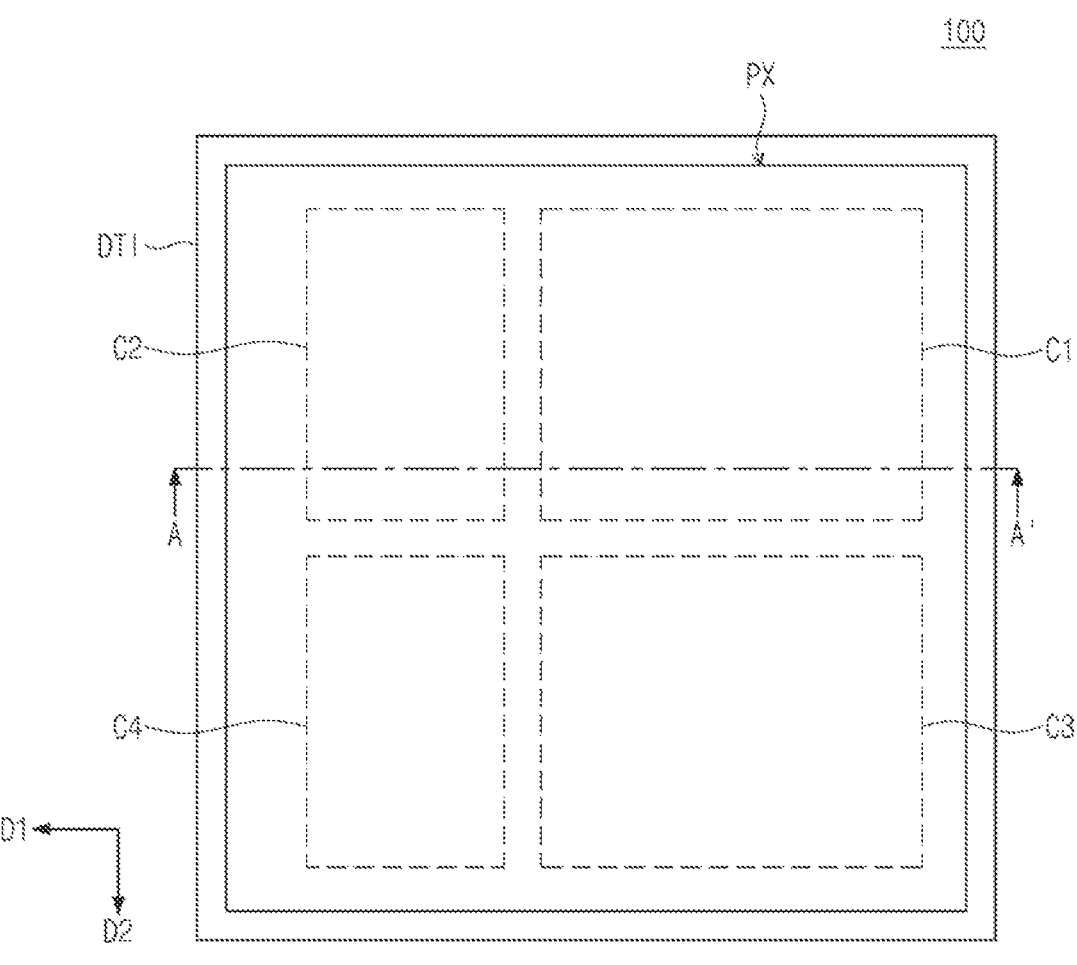
FIG. 2 is a plan view illustrating an image sensor according to some embodiments.
Figure 3:
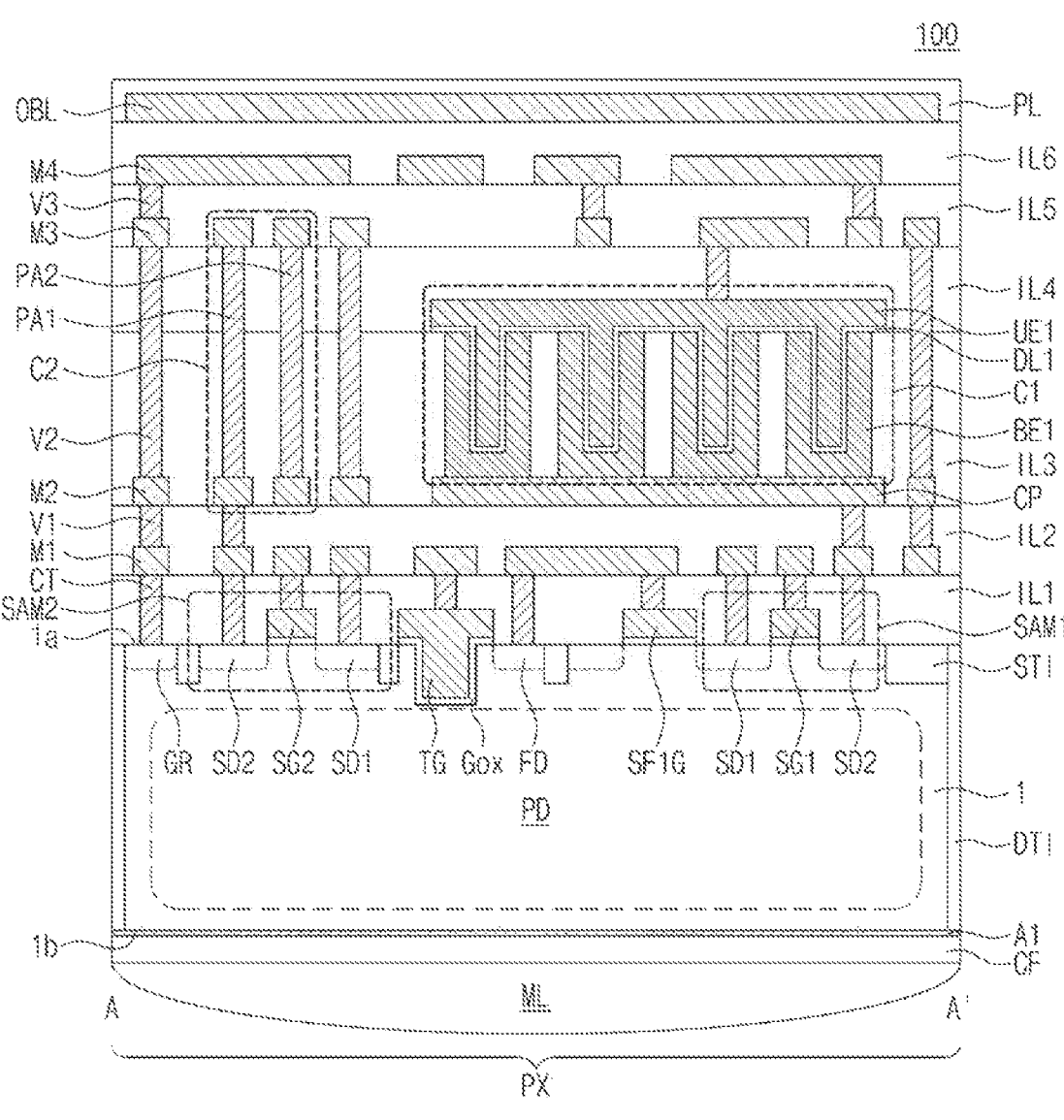
FIG. 3 is a sectional view of an image sensor according to some embodiments, taken along a line A-A' of FIG. 2.

FIG. 2 is a plan view illustrating an image sensor according to some embodiments. FIG. 3 is a sectional view of an image sensor according to some embodiments, taken along a line A-A' of FIG. 2.

Referring to FIGS. 2 and 3, an image sensor 100 according to some embodiments may include a first substrate 1. The first substrate 1 may be, for example, a single-crystalline silicon wafer, a silicon epitaxial layer, or a silicon-on-insulator (SOI) wafer. In an embodiment, the first substrate 1 may be doped with impurities of a first conductivity type. For example, the first conductivity type may be p-type. The first substrate 1 may include a front surface 1a and a rear surface 1b, which are opposite to each other. In the present specification, the front surface 1a and the rear surface 1b may be referred to as a first surface 1a and a second surface 1b, respectively.

A device isolation portion DTI may be disposed in the first substrate 1 to separate a plurality of pixels PX from each other. The pixels PX may be alternately or two-dimensionally arranged in a first direction D1 and a second direction D2. In the embodiment illustrated in FIGS. 2-3, each of the pixels PX may have the shape of a square or rectangular. The device isolation portion DTI may be provided to penetrate the first substrate 1. The device isolation portion DTI may include a conductive pattern and an insulating pattern enclosing the conductive pattern.

Photoelectric conversion parts PD may be disposed in the pixels PX, respectively, and in the first substrate 1. The photoelectric conversion parts PD may be doped with impurities, which are of a second conductivity type that is different from the first conductivity type. For example, the second conductivity type may be n-type. The photoelectric conversion part PD doped with the n-type impurities may form a pn junction, which is used as a photodiode, in conjunction with the first substrate 1 doped with the p-type impurities.

Device isolation portions STI may be disposed in regions of the first substrate 1 adjacent to the front surface 1a. The device isolation portions STI may be pierced by the pixel isolation portion DTI. The device isolation portions STI may delimit active regions, which are adjacent to the front surface 1a, in each of the pixels PX. The active regions may be used as parts of the transistors TX, RX, DCX, SF1, SF2, SEL, SAM1, SAM2, SAM3, and SAM4 of FIG. 1.

Referring to FIG. 3, in each pixel PX, a transfer gate TG may be disposed on the front surface 1a of the first substrate 1. A portion of the transfer gate TG may be extended into the first substrate 1. In some embodiments, the transfer gate TG may be of a vertical type. In some embodiments, the transfer gate TG may be of a planar type; for example, the transfer gate TG may not be extended into the first substrate 1 and may have a flat shape. A gate insulating layer Gox may be interposed between the transfer gate TG and the first substrate 1. The floating diffusion region FD may be disposed in a region of the first substrate 1 adjacent to one side of the transfer gate TG. The floating diffusion region FD may be doped with impurities (e.g., of the second conductivity type).

In some embodiments, the image sensor 100 may be a back-side light-receiving image sensor. Light may be incident into the first substrate 1 through the rear surface 1b of the first substrate 1. Electron-hole pairs may be generated in the pn junction by the incident light. The electrons produced by this process may be transferred to the photoelectric conversion part PD. If a voltage is applied to the transfer gate TG, the electrons may be transferred to the floating diffusion region FD.

Referring to FIG. 3, a first source follower gate SF1G, a first sampling gate SG1, and a second sampling gate SG2 may be disposed on the front surface 1a of the first substrate 1. The gate insulating layer Gox may be disposed under each of the first source follower gate SF1G, the first sampling gate SG1, and the second sampling gate SG2. A first source/drain region SD1 and a second source/drain region SD2 may be respectively disposed in two separate regions of the first substrate 1, which are located at sides of the first and second sampling gates SG1 and SG2. The first and second source/drain regions SD1 and SD2 may be doped with impurities of the second conductivity type. One of the first source/drain regions SD1 may be disposed between the first source follower gate SF1G and the first sampling gate SG1.

The first sampling gate SG1 and the first and second source/drain regions SD1 and SD2, which are provided at sides of the first sampling gate SG1, may constitute a first sampling transistor SAM1. The second sampling gate SG2 and the first and second source/drain regions SD1 and SD2, which are provided at sides of the second sampling gate SG2, may constitute a second sampling transistor SAM2. The first source/drain regions SD1 may correspond to the first terminals of the first and second sampling transistors SAM1 and SAM2. The second source/drain regions SD2 may correspond to the second terminals of the first and second sampling transistors SAM1 and SAM2.

A ground region GR may be disposed in the first substrate 1. The ground region GR may be doped to have the first conductivity type and have an impurity concentration that is higher than the first substrate 1.

The front surface 1a of the first substrate 1 may be covered with a first interlayer insulating layer IL1. A plurality of contacts CT may be disposed in the first interlayer insulating layer IL1. The contacts CT may be respectively connected to the gates TG, SF1G, SG1, and SG2, the first and second source/drain regions SD1 and SD2, and the ground region GR. First interconnection lines M1 may be disposed on the first interlayer insulating layer IL1. One of the first interconnection lines M1 may connect the floating diffusion region FD to the first source follower gate SF1G.

The first interconnection lines M1 may be covered with a second interlayer insulating layer IL2. A plurality of first vias V1 may be disposed in the second interlayer insulating layer IL2. Second interconnection lines M2 and a first conductive pattern CP may be disposed on the second interlayer insulating layer IL2. The second interconnection lines M2 and the first conductive pattern CP may be covered with a third interlayer insulating layer IL3.

A plurality of first lower electrodes BE1 may be disposed in the third interlayer insulating layer IL3 to be in contact with the first conductive pattern CP. The first lower electrodes BE1 may have a concave cup shape. A first dielectric layer DL1 may be disposed on the first lower electrodes BE1. A portion of the first dielectric layer DL1 may be extended to cover the third interlayer insulating layer IL3. The first dielectric layer DL1 may not cover outer side surfaces of the first lower electrodes BE1. A first upper electrode UE1 may be disposed on the first dielectric layer DL1. The first upper electrode UE1, the first dielectric layer DL1, and the first lower electrodes BE1 may constitute the first capacitor C1. In the first capacitor C1, a portion of the first upper electrode UE1 and a portion of the first dielectric layer DL1 may be inserted into the first lower electrodes BE1. That is, in some embodiments, the portion of the first upper electrode UE1 and the portion of the first dielectric layer DL1 may extend into and between ones of the first lower electrodes BE1, as illustrated in FIG. 3 by way of example. The first conductive pattern CP may be connected to the second source/drain region SD2 of the first sampling transistor SAM1 through one of the first vias V1, one of the first interconnection lines M1, and one of the contacts CT. In other words, the first capacitor C1 may be connected to the second source/drain region SD2 of the first sampling transistor SAM1. The first capacitor C1 may be a concave embedded capacitor.

The first upper electrode UE1 may be covered with a fourth interlayer insulating layer IL4. A plurality of second vias V2, a first conductive pillar PA1, and a second conductive pillar PA2 may be provided to penetrate the fourth interlayer insulating layer IL4 and the third interlayer insulating layer IL3 and may be respectively connected to some of the second interconnection lines M2. One of the second vias V2 may be provided to penetrate the fourth interlayer insulating layer IL4 and may be connected to the first upper electrode UE1.

The first and second conductive pillars PA1 and PA2 may be adjacent to each other. The first conductive pillar PA1 may be connected to the second source/drain region SD2 of the second sampling transistor SAM2 through one of the second interconnection lines M2, one of the first vias V1, one of the first interconnection lines M1, and one of the contacts CT. The first conductive pillar PA1 may be electrically disconnected from the second conductive pillar PA2. The third and fourth interlayer insulating layers IL3 and IL4 may be interposed between the first and second conductive pillars PA1 and PA2. The first and second conductive pillars PA1 and PA2, which are adjacent to each other, and the third and fourth interlayer insulating layers IL3 and IL4 therebetween may constitute a second capacitor C2. In an embodiment, the second capacitor C2 may be a vertical natural (VN) capacitor. A level of a top end of the first capacitor C1 may be different from a level of a top end of the second capacitor C2, as illustrated in FIG. 3 by way of example.

The first upper electrode UE1 may be formed of or include a material different from the first conductive pillar PA1. The first lower electrode BE1 may be formed of or include a material different from the first conductive pillar PA1. The first dielectric layer DL1 may be formed of or include a material different from the third and fourth interlayer insulating layers IL3 and IL4. In an embodiment, the first dielectric layer DL1 may be formed of or include at least one of metal oxide materials (e.g., aluminum oxide, hafnium oxide, iridium oxide, and ruthenium oxide).

Third interconnection lines M3 may be disposed on the fourth interlayer insulating layer IL4. Some of the third interconnection lines M3 may be connected to the second vias V2 and the first and second conductive pillars PA1 and PA2. The third interconnection lines M3 may be covered with a fifth interlayer insulating layer IL5. Third vias V3 may be disposed in the fifth interlayer insulating layer IL5, and some of the third vias V3 may be in contact with the third interconnection lines M3. Fourth interconnection lines M4 may be disposed on the fifth interlayer insulating layer IL5. The fourth interconnection lines M4 may be covered with a sixth interlayer insulating layer IL6. Each of the first to sixth interlayer insulating layers IL1 to IL6 may be independently formed of or include at least one of silicon oxide, silicon nitride, silicon oxynitride, or porous insulating materials and may have a single- or multi-layered structure.

An upper metal plate OBL may be disposed on the sixth interlayer insulating layer IL6. The upper metal plate OBL may be formed of or include at least one of metallic materials (e.g., tungsten or copper). The upper metal plate OBL may be covered with a passivation layer PL. The passivation layer PL may be formed of or include at least one of silicon oxide, SiCN, or SiN and may have a single- or multi-layered structure. The upper metal plate OBL may be provided to account for most area of each pixel PX. The upper metal plate OBL may serve as an EMI shield of shielding the image sensor 100 from an external electric field. The upper metal plate OBL may also prevent light outside the passivation layer PL from being incident into the first substrate 1. In some embodiments, the upper metal plate OBL may be used as a reflection plate reflecting light, which is incident through the second surface 1b of the first substrate 1 and passes through the first to sixth interlayer insulating layers IL1 to IL6, toward the photoelectric conversion part PD, and in this case, it may be possible to reduce an amount of light to be leaked to the outside.

The rear surface 1b of the first substrate 1 may be covered with a fixed charge layer A1. The fixed charge layer A1 may be in contact with the rear surface 1b. The fixed charge layer A1 may have negative fixed charges. The fixed charge layer A1 may be formed of metal oxide or metal fluoride containing at least one metal, which is selected from the group consisting of hafnium (Hf), zirconium (Zr), aluminum (Al), tantalum (Ta), titanium (Ti), yttrium (Y), and lanthanoid. For example, the fixed charge layer A1 may be a hafnium oxide layer or an aluminum oxide layer. A hole accumulation phenomenon may occur near the fixed charge layer A1. In this case, it may be possible to effectively suppress the dark current issue and the white spot issue.

Color filters CF may be disposed on the fixed charge layer A1. The color filters CF may be arranged to form a Bayer pattern, a 2×2 tetra pattern, a 3×3 Nona pattern, or a 4×4 hexadeca pattern. Micro lenses ML may be disposed on the color filters CF, respectively.

Referring to FIGS. 2 and 3, a planar area of the first capacitor C1 may be larger than a planar area of the second capacitor C2. A capacitance of the first capacitor C1 may be greater than a capacitance of the second capacitor C2. Although only the first and second capacitors C1 and C2 are illustrated in FIG. 3, the third and fourth capacitors C3 and C4, as shown in FIG. 2, may also be disposed in specific layers of the first to sixth interlayer insulating layers IL1 to IL6, regardless of the first and second capacitors C1 and C2. As described with reference to FIG. 1, the third capacitor C3 may be connected to the second terminal of the third sampling transistor SAM3. The fourth capacitor C4 may be connected to the second terminal of the fourth sampling transistor SAM4. A planar area of the third capacitor C3 may be larger than a planar area of the fourth capacitor C4. A capacitance of the third capacitor C3 may be greater than a capacitance of the fourth capacitor C4. The first and third capacitors C1 and C3 may store electrical signals, which are generated from the pixel PX in a high-brightness operation. The second and fourth capacitors C2 and C4 may store electrical signals, which are generated from the pixel PX in a low-brightness operation.

In the image sensor 100 according to some embodiments, as described above, the capacitors C1 to C4 with different structures and/or materials may be disposed on each of the pixels PX to realize a difference in capacitance. Accordingly, it may be possible to realize a high-quality image with an improved HDR property.

Figure 4:
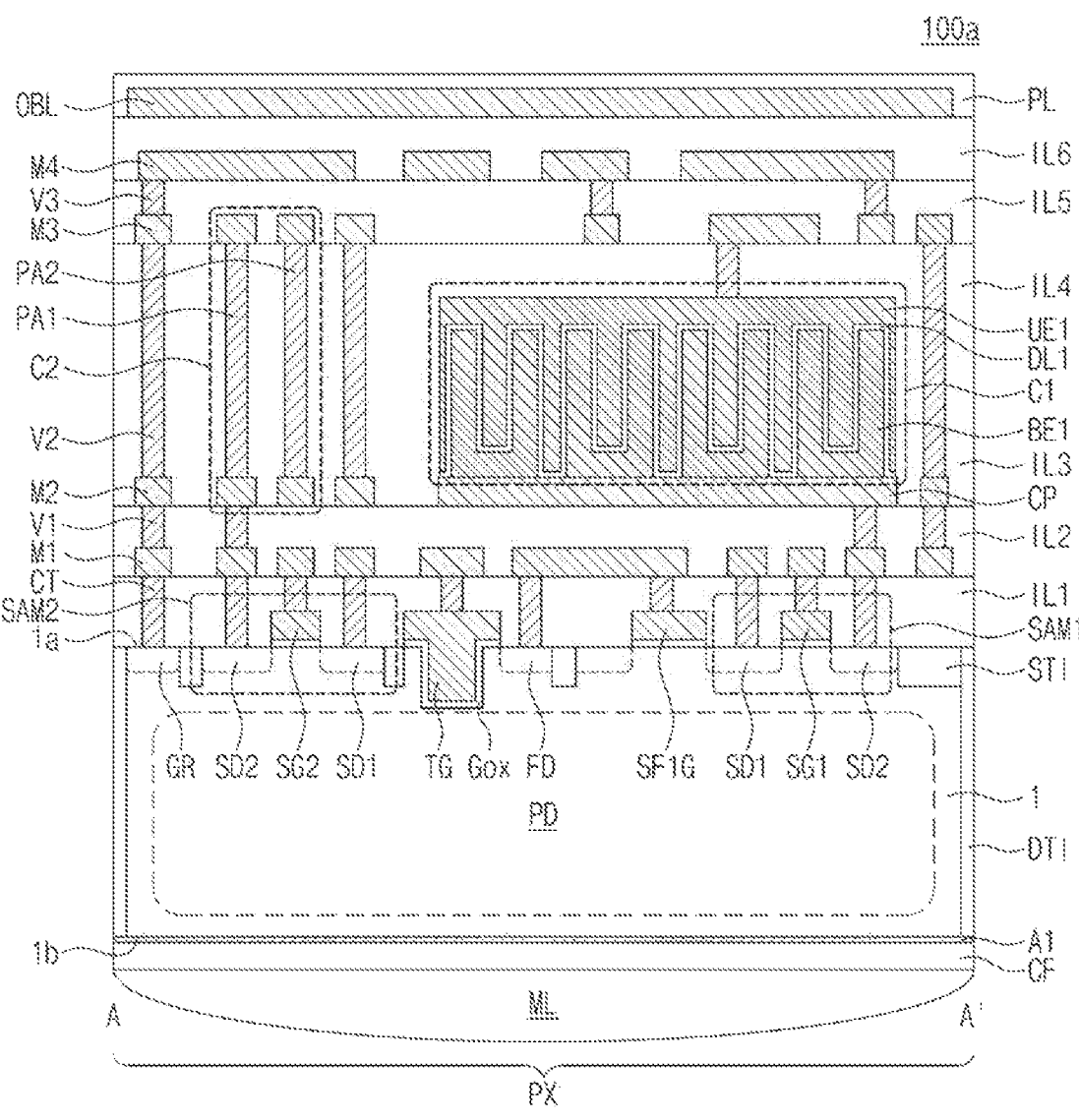
FIG. 4 is a sectional view of an image sensor according to some embodiments, taken along the line A-A' of FIG. 2.

FIG. 4 is a sectional view of an image sensor according to some embodiments, taken along the line A-A' of FIG. 2.

Referring to FIG. 4, in an image sensor 100a, the first capacitor C1 may be a one-cylinder-stacked (OCS) capacitor. In the first capacitor C1, the first dielectric layer DL1 may be extended to cover outer side surfaces of the first lower electrodes BE1. A portion of the first upper electrode UE1 may be extended to be interposed between the first lower electrodes BE1. Except for the afore-described differences, the image sensor according to the embodiment illustrated in FIG. 4 may have substantially the same features as that described with reference to FIGS. 2 and 3.

Figure 5:
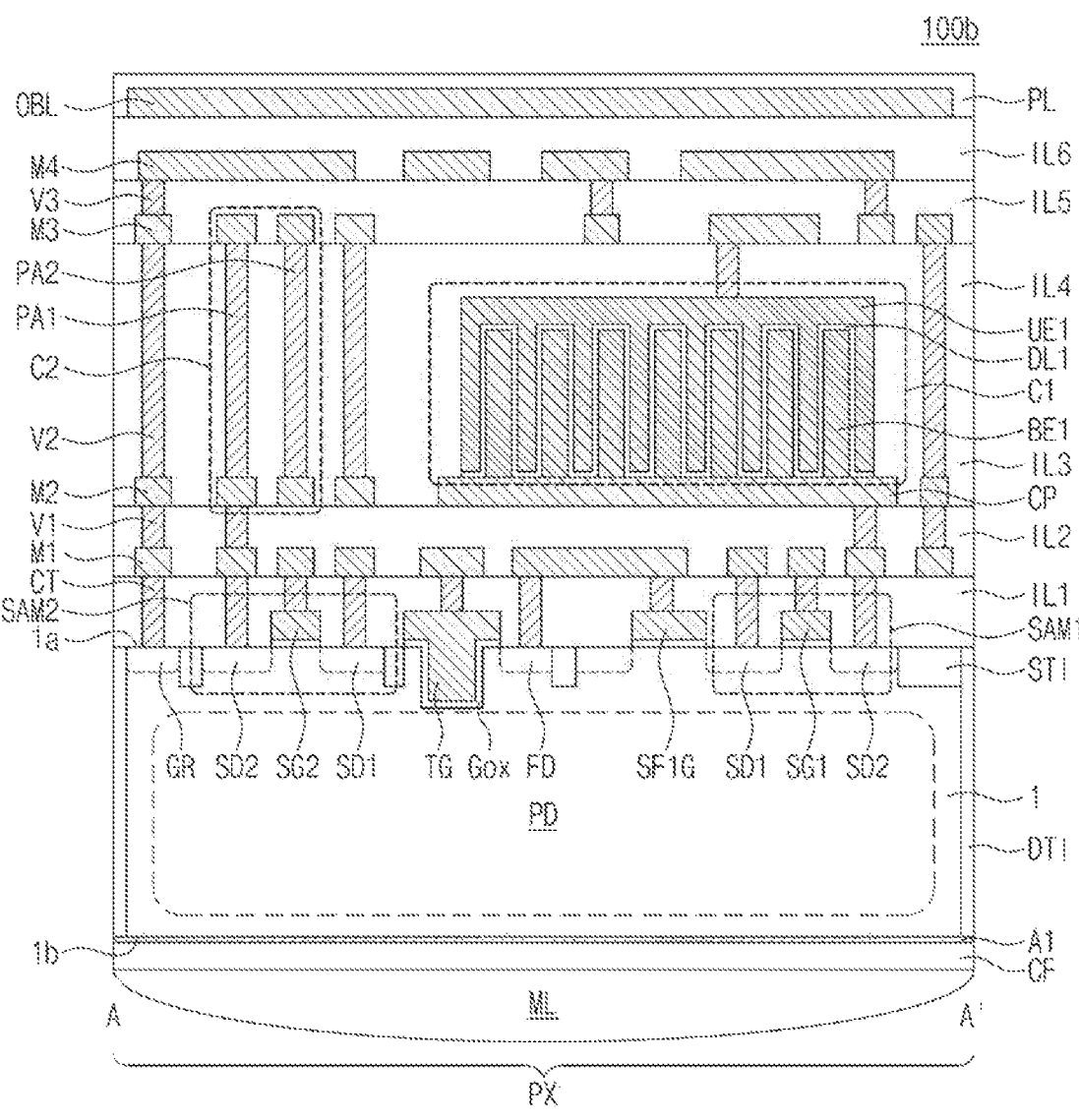
FIG. 5 is a sectional view of an image sensor according to some embodiments, taken along the line A-A' of FIG. 2.

FIG. 5 is a sectional view of an image sensor according to some embodiments, taken along the line A-A' of FIG. 2.

Referring to FIG. 5, in an image sensor 100b, each of the first lower electrodes BE1 of the first capacitor C1 may have a pillar shape. In the first capacitor C1, the first dielectric layer DL1 may be extended to cover outer side surfaces of the first lower electrodes BE1. A portion of the first upper electrode UE1 may be extended to be interposed between the first lower electrodes BE1. Except for the afore-described differences, the image sensor according to the embodiment illustrated in FIG. 5 may have substantially the same features as that described with reference to FIGS. 2 and 3.

Figure 6:
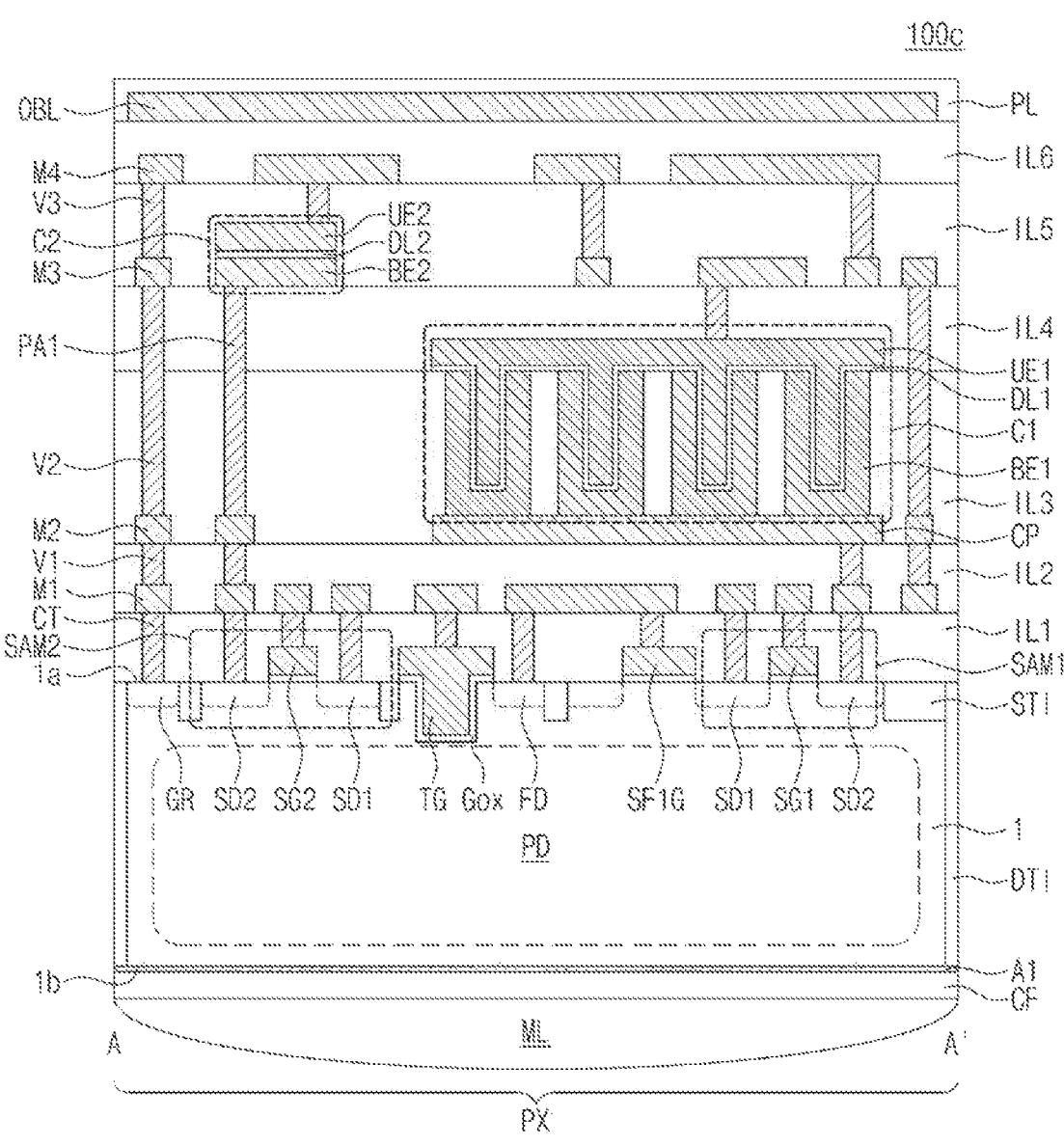
FIG. 6 is a sectional view of an image sensor according to some embodiments, taken along the line A-A' of FIG. 2.

FIG. 6 is a sectional view of an image sensor according to some embodiments, taken along the line A-A' of FIG. 2.

Referring to FIG. 6, in an image sensor 100c, the second capacitor C2 may be disposed on the fourth interlayer insulating layer IL4. A level of a top end of the first capacitor C1 may be different from a level of a top end of the second capacitor C2. A level of a bottom end of the first capacitor C1 may be different from a level of a bottom end of the second capacitor C2. The second capacitor C2 may include a second lower electrode BE2, a second dielectric layer DL2, and a second upper electrode UE2, which are sequentially stacked. Each of the second lower electrode BE2, the second dielectric layer DL2, and the second upper electrode UE2 may have a plate shape. The second lower electrode BE2 may be connected to the first conductive pillar PA1. In some embodiments, the second conductive pillar PA2 of FIG. 3 may be omitted from the image sensor 100c of FIG. 6. The second capacitor C2 may be a metal-insulator-metal (MIM) capacitor. The second lower electrode BE2 may be formed of or include a material that is the same as or different from the first lower electrode BE1. The second upper electrode UE2 may be formed of or include a material that is the same as or different from the first upper electrode UE1. The second dielectric layer DL2 may be formed of or include a material that is the same as or different from the first dielectric layer DL1. A planar area of the second capacitor C2 may be smaller than a planar area of the first capacitor C1. A capacitance of the second capacitor C2 may be smaller than a capacitance of the first capacitor C1. Except for the afore-described differences, the image sensor according to the embodiment illustrated in FIG. 6 may have substantially the same features as that described with reference to FIGS. 2 and 3.

Figure 7:
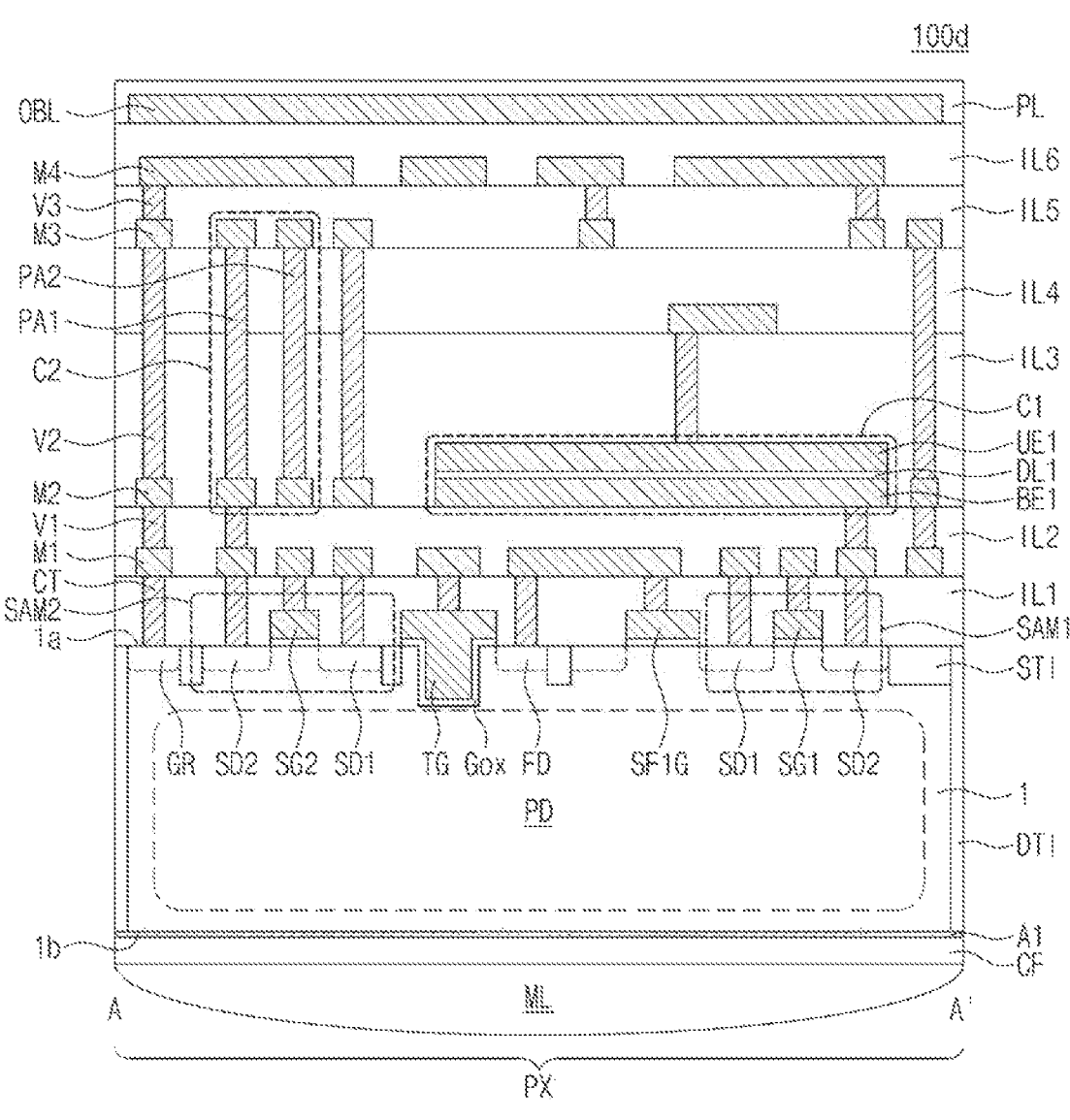
FIG. 7 is a sectional view of an image sensor according to some embodiments, taken along the line A-A' of FIG. 2.

FIG. 7 is a sectional view of an image sensor according to some embodiments, taken along the line A-A' of FIG. 2.

Referring to FIG. 7, in an image sensor 100d, the first capacitor C1 may include the first lower electrode BE1, the first dielectric layer DL1, and the first upper electrode UE1, which are sequentially stacked. Each of the first lower electrode BE1, the first dielectric layer DL1, and the first upper electrode UE1 may have a plate shape. The first capacitor C1 may be an MIM-type capacitor. Except for the afore-described differences, the image sensor according to the embodiment illustrated in FIG. 7 may have substantially the same features as that described with reference to FIGS. 2 and 3.

Figure 8:
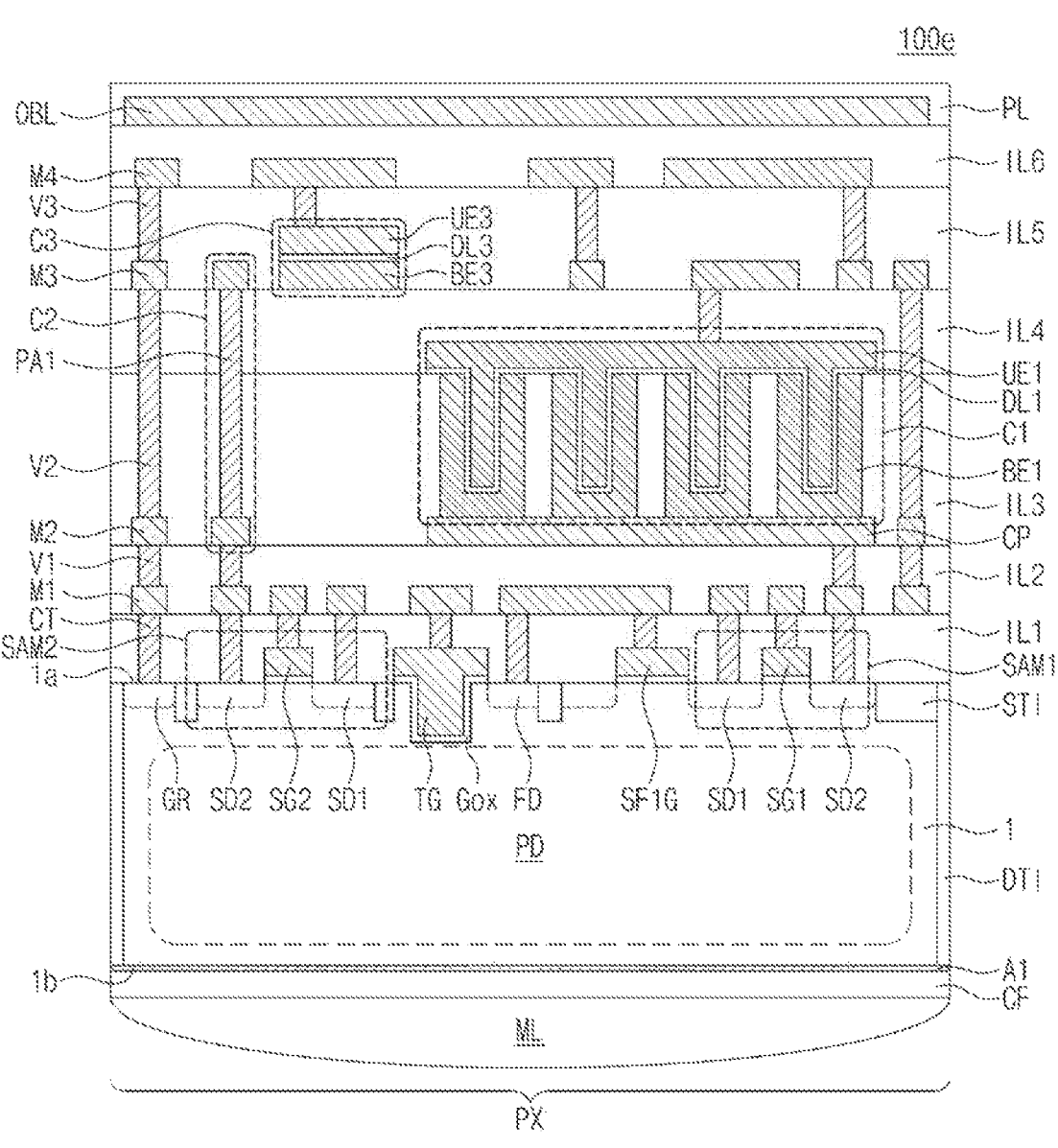
FIG. 8 is a sectional view illustrating an image sensor according to some embodiments.

FIG. 8 is a sectional view illustrating an image sensor according to some embodiments.

Referring to FIG. 8, in an image sensor 100e, the second capacitor C2 may include the first conductive pillar PA1. The first conductive pillar PA1 may form a VN capacitor in combination with either the second via V2 or the second conductive pillar PA2 (not shown in FIG. 8). The third capacitor C3 may be disposed on the fourth interlayer insulating layer IL4. The third capacitor C3 may include a third lower electrode BE3, a third dielectric layer DL3, and a third upper electrode UE3, which are sequentially stacked. Each of the third lower electrode BE3, the third dielectric layer DL3, and the third upper electrode UE3 may have a plate shape. The third capacitor C3 may be an MIM-type capacitor. Although not shown in FIG. 8, the third lower electrode BE3 of the third capacitor C3 may be connected to the second terminal of the third sampling transistor SAM3 of FIG. 1. A planar area of the third capacitor C3 may be smaller than a planar area of the first capacitor C1. A capacitance of the third capacitor C3 may be less than a capacitance of the first capacitor C1 but may be greater than a capacitance of the second capacitor C2. Except for the afore-described differences, the image sensor according to the embodiment illustrated in FIG. 8 may have substantially the same features as that described with reference to FIGS. 2 and 3.

Figure 9:
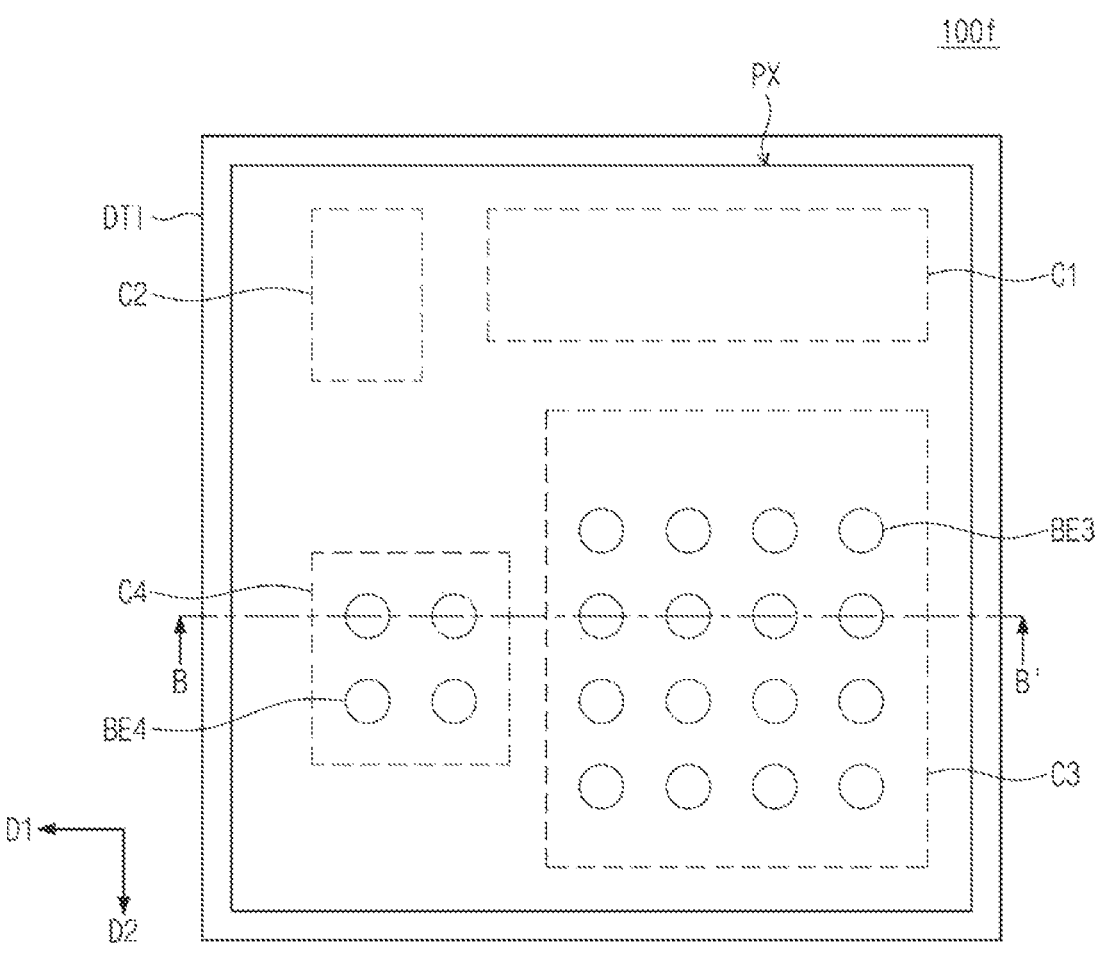
FIG. 9 is a plan view illustrating an image sensor according to some embodiments.
Figure 10:
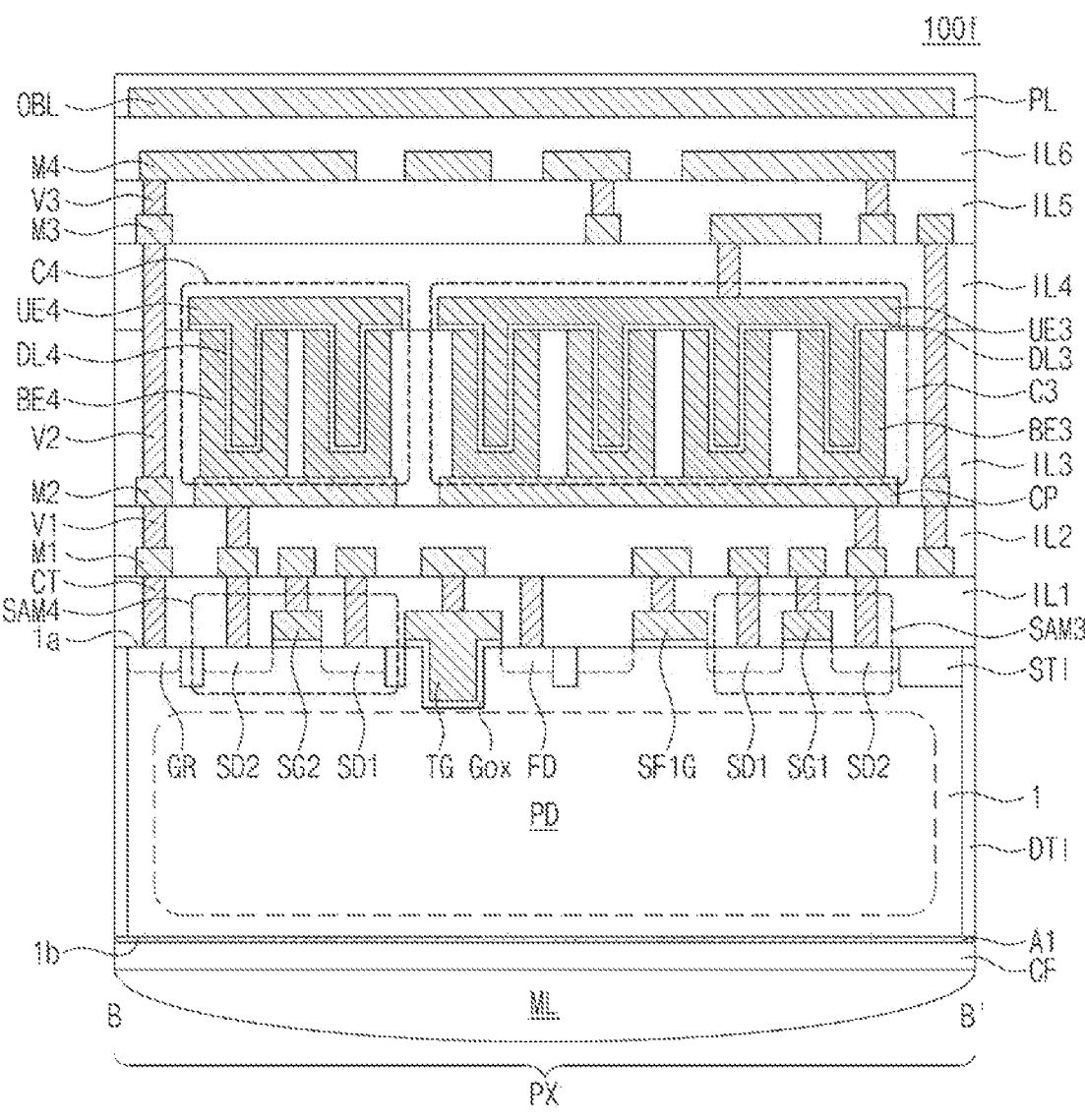
FIG. 10 is a sectional view of an image sensor according to some embodiments, taken along a line B-B' of FIG. 9.

FIG. 9 is a plan view illustrating an image sensor according to some embodiments. FIG. 10 is a sectional view of an image sensor according to some embodiments, taken along a line B-B' of FIG. 9.

Referring to FIGS. 9 and 10, in an image sensor 100f, the first to fourth capacitors C1 to C4 may be provided to have areas, structures, and/or shapes different from each other and may have capacitances different from each other. The first capacitor C1 may be one of the concave embedded capacitor, the OCS capacitor, and the MIM-type capacitor, described with reference to FIGS. 2 to 7. The second capacitor C2 may be a vertical natural (VN) capacitor. Each of the third and fourth capacitors C3 and C4 may be a concave embedded capacitor. The number of the third lower electrodes BE3 in the third capacitor C3 may be greater than the number of the fourth lower electrodes BE4 in the fourth capacitor C4. Thus, a capacitance of the third capacitor C3 may be greater than a capacitance of the fourth capacitor C4. The third and fourth capacitors C3 and C4 may be located at the same height. Except for the afore-described differences, the image sensor according to the embodiment illustrated in FIGS. 9-10 may have substantially the same features as that described with reference to FIGS. 1 to 3.

Figure 11:
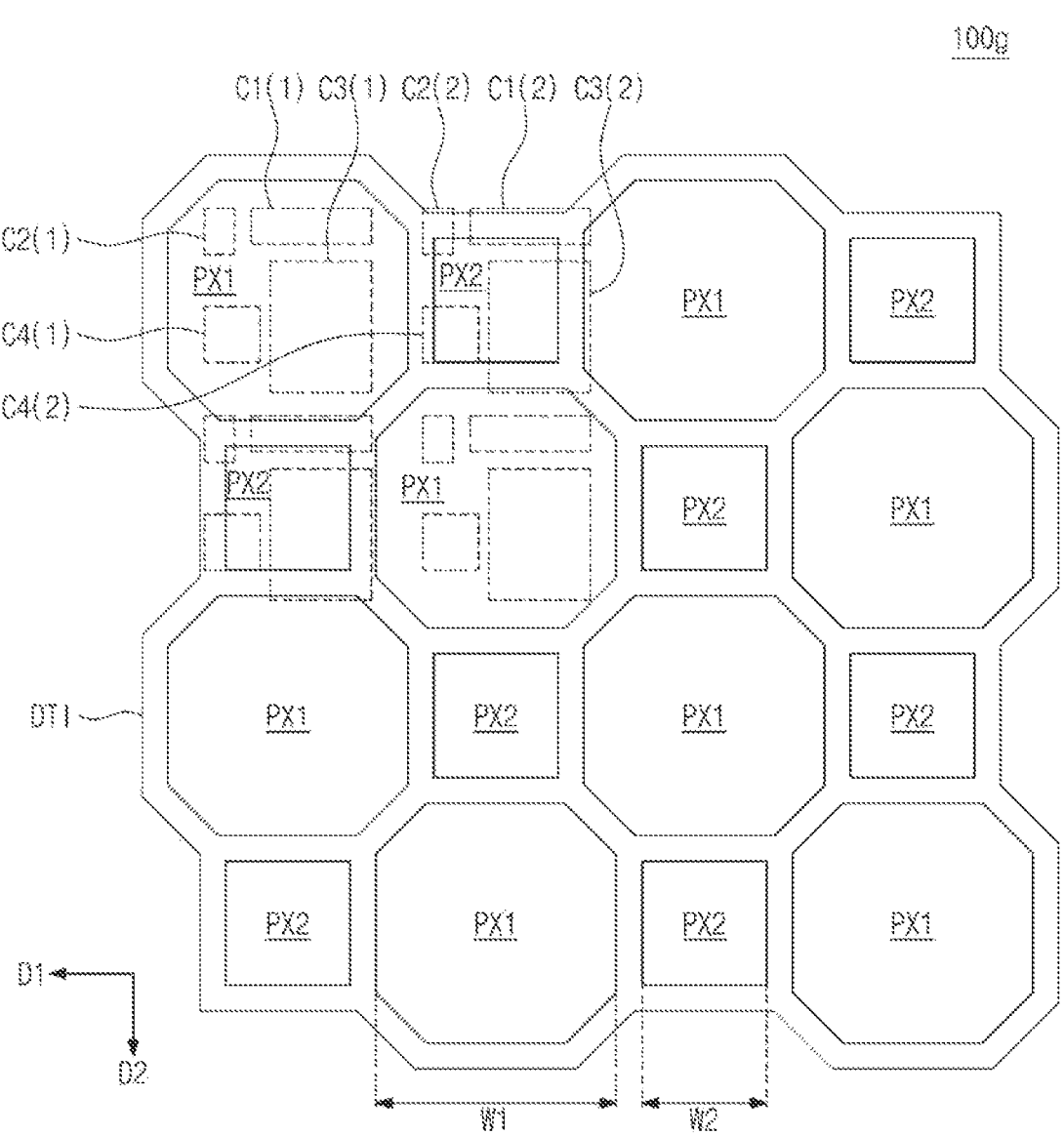
FIG. 11 is a plan view illustrating an image sensor according to some embodiments.

FIG. 11 is a plan view illustrating an image sensor according to some embodiments.

Referring to FIG. 11, an image sensor 100g may include first pixels PX1 and second pixels PX2. The first pixels PX1 and the second pixels PX2 may be separated from each other by the device isolation portion DTI. The first pixels PX1 may have an octagonal shape, when viewed in a plan view. In an embodiment, the first pixels PX1 may have the shape of a regular octagon, when viewed in a plan view, and may have eight sides having the same length/width. The second pixels PX2 may have a tetragonal shape, when viewed in a plan view. In an embodiment, the second pixels PX2 may have the shape of a square, when viewed in a plan view, and may have four sides having the same length/width W2. Each of the first pixels PX1 may have a first width W1 in the first direction D1. Each of the second pixels PX2 may have a second width W2, which is smaller than the first width W1, in the first direction D1. In an embodiment, the first width W1 may be $(1+\sqrt{2})$ times the second width W2. In some embodiments, the first width W1 may be $(1+\sqrt{2})$ times the second width W2.

The first pixels PX1 may be color pixels, which are used to realize an image and are provided to have specific colors. Each of color filters, which are placed on the first pixels PX1, may independently have one color among blue, green, and red. The color filters may be arranged to form a Bayer pattern, a 2×2 tetra pattern, a 3×3 Nona pattern, or a 4×4 hexadeca pattern.

The second pixels PX2 may be white pixels, which are used to improve sensitivity or brightness of the image sensor. A white or colorless (e.g., transparent) filter may be disposed on the second pixels PX2, but in an embodiment, portions of a micro lens or patterns, which are formed of the same material as the micro lens, may be disposed on the second pixels PX2.

In an embodiment, first to fourth capacitors C1(1) to C4(1) may be disposed on the first pixels PX1, respectively. The first to fourth capacitors C1(1) to C4(1) on the first pixel PX1 may be provided to have different planar areas from each other. The first to fourth capacitors C1(1) to C4(1) may overlap the first pixel PX1.

In an embodiment, first to fourth capacitors C1(2) to C4(2) may be disposed on the second pixels PX2, respectively. The first to fourth capacitors C1(2) to C4(2) on the second pixel PX2 may be provided to have different planar areas from each other. The first to fourth capacitors C1(2) to C4(2) may overlap the second pixel PX2 and the device isolation portion DTI. The first to fourth capacitors C1(2) to C4(2) on the second pixel PX2 may partially overlap the first pixel PX1 adjacent thereto. Except for the afore-described differences, the image sensor according to the embodiment illustrated in FIG. 11 may have substantially the same features as that described with reference to FIGS. 1 to 10.

Figure 12:
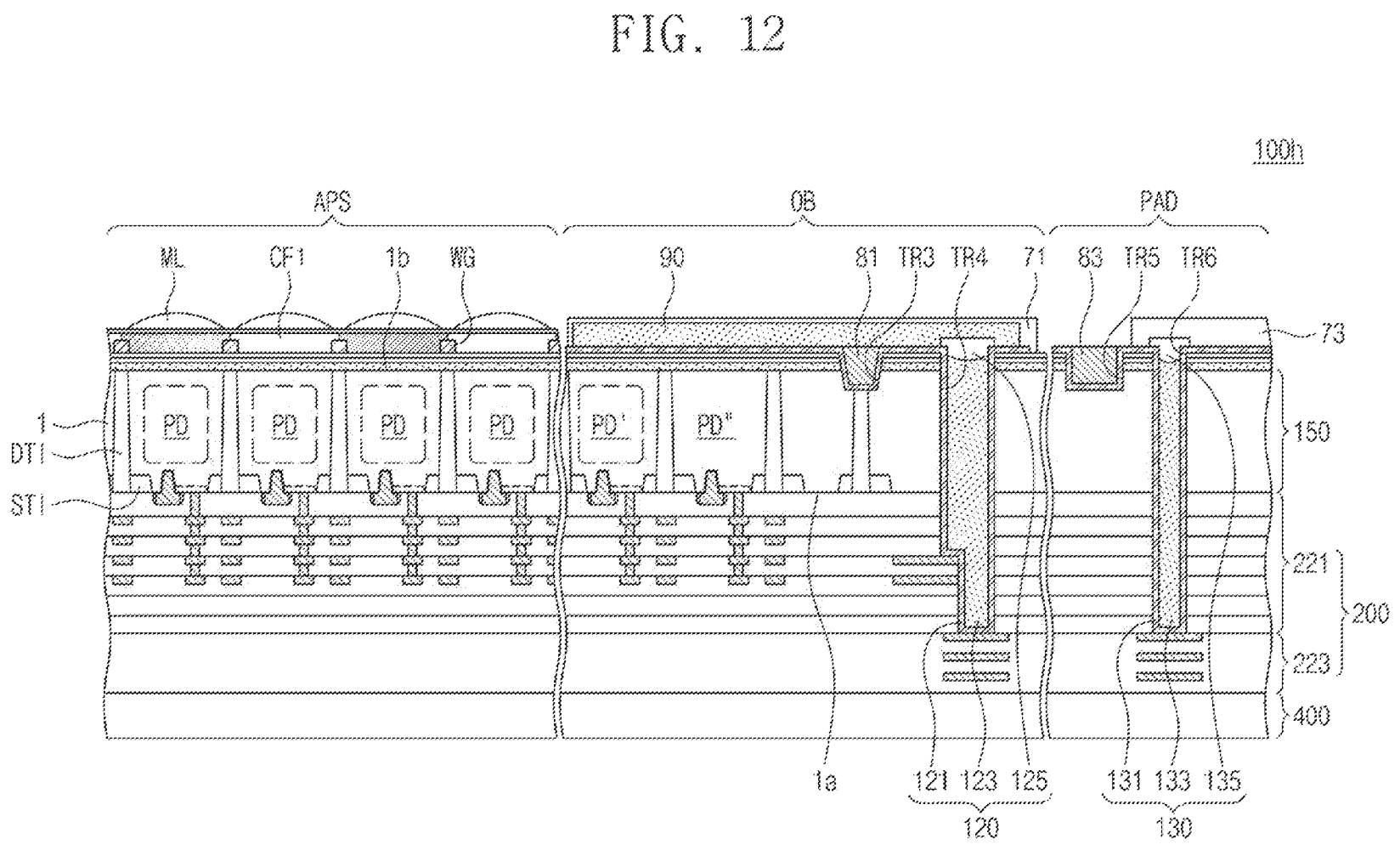

FIG. 12 is a sectional view illustrating an image sensor according to some embodiments.

Referring to FIG. 12, an image sensor 100h may include a first substrate 1, an interconnection layer 200 on a front surface 1a of the first substrate 1, and a second substrate 400 on the interconnection layer 200, and here, the first substrate 1 may include a pixel array region APS, an optical black region OB, and a pad region PAD. The interconnection layer 200 may include an upper interconnection layer 221 and a lower interconnection layer 223. The pixel array region APS may include a plurality of pixels PX. The pixels PX in the pixel array region APS may be substantially the same as those described with reference to FIGS. 1 to 11.

In the optical black region OB, a light-blocking pattern WG, a first connection structure 120, a first conductive pad 81, and a bulk color filter 90 may be provided on the first substrate 1. The first connection structure 120 may include a first connection line 121, an insulating pattern 123, and a first capping pattern 125.

A portion of the first connection line 121 may be provided on a rear surface 1b of the first substrate 1. The light-blocking pattern WG may cover the rear surface 1b and may conformally cover inner surfaces of third and fourth trenches TR3 and TR4. The first connection line 121 may be provided to penetrate a photoelectric conversion layer 150 and the upper interconnection layer 221 and connect the photoelectric conversion layer 150 to the interconnection layer 200. More specifically, the first connection line 121 may be in contact with interconnection lines in the upper and lower interconnection layers 221 and 223 and with a conductive pattern of a device isolation portion DTI in the photoelectric conversion layer 150. Thus, the first connection structure 120 may be electrically connected to the interconnection lines in the interconnection layer 200. The first connection line 121 may be formed of or include a metallic material (e.g., tungsten). The light-blocking pattern WG may prevent light from being incident into the optical black region OB.

The first conductive pad 81 may be provided in the third trench TR3 to fill a remaining portion of the third trench TR3. The first conductive pad 81 may be formed of or include at least one of metallic materials (e.g., aluminum). The first conductive pad 81 may be connected to a conductive isolation pattern 14 of FIG. 13. A negative bias voltage may be applied to the conductive isolation pattern 14 of the device isolation portion DTI of FIG. 13 through the first conductive pad 81. In this case, it may be possible to prevent or suppress a white spot issue or a dark current issue.

The insulating pattern 123 may fill a remaining portion of the fourth trench TR4. The insulating pattern 123 may be provided to penetrate the photoelectric conversion layer 150 and the entirety or at least a portion of the interconnection layer 200. The first capping pattern 125 may be provided on a top surface of the insulating pattern 123. The first capping pattern 125 may be provided on the insulating pattern 123.

The bulk color filter 90 may be provided on the first conductive pad 81, the light-blocking pattern WG, and the first capping pattern 125. The bulk color filter 90 may cover the first conductive pad 81, the light-blocking pattern WG, and the first capping pattern 125. A first protection layer 71 may be provided on the bulk color filter 90 to hermetically seal the bulk color filter 90.

A photoelectric conversion region PD' and a dummy region PD" may be provided in the optical black region OB of the first substrate 1. The photoelectric conversion region PD' may be doped to have a second conductivity type different from the first conductivity type. The second conductivity type may be, for example, n-type. The photoelectric conversion region PD' may have a structure similar to the photoelectric conversion part PD but may not be used for the operation of converting light to electric signals, unlike the photoelectric conversion part PD. The dummy region PD" may be doped with impurities. A signal generated in the dummy region PD" may be used as information for removing process noises, in a subsequent step.

In the pad region PAD, a second connection structure 130, a second conductive pad 83, and a second protection layer 73 may be provided on the first substrate 1. The second connection structure 130 may include a second connection line 131, an insulating pattern 133, and a second capping pattern 135.

The second connection line 131 may be provided on the rear surface 1b of the first substrate 1. More specifically, the second connection line 131 may cover the rear surface 1b and may conformally cover inner surfaces of fifth and sixth trenches TR5 and TR6. The second connection line 131 may be provided to penetrate the photoelectric conversion layer 150 and the upper interconnection layer 221 and to connect the photoelectric conversion layer 150 to the interconnection layer 200. More specifically, the second connection line 131 may be in contact with the interconnection lines in the lower interconnection layer 223. Accordingly, the second connection structure 130 may be electrically connected to the interconnection lines in the interconnection layer 200. The second connection line 131 may be formed of or include at least one of metallic materials (e.g., tungsten).

The second conductive pad 83 may be provided in the fifth trench TR5 to fill a remaining portion of the fifth trench TR5. The second conductive pad 83 may be formed of or include at least one of metallic materials (e.g., aluminum). The second conductive pad 83 may be used as a conduction path, which is used for electric connection to the outside of the image sensor. The insulating pattern 133 may fill a remaining portion of the sixth trench TR6. The insulating pattern 133 may be provided to penetrate the photoelectric conversion layer 150 and the entirety or at least a portion of the interconnection layer 200. The second capping pattern 135 may be provided on the insulating pattern 133.

Figure 13:
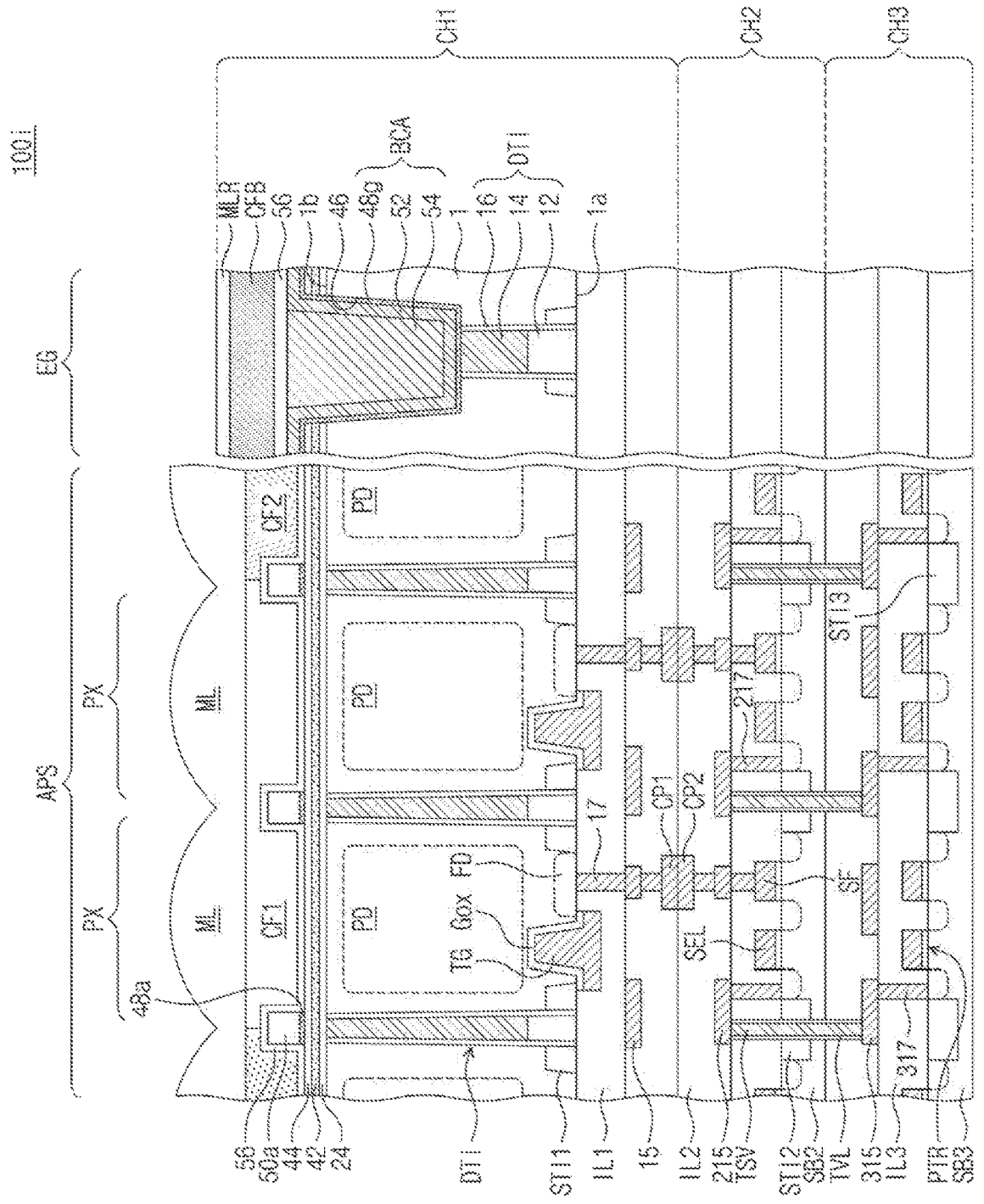
FIG. 13 is a sectional view illustrating an image sensor according to some embodiments.

FIG. 13 is a sectional view illustrating an image sensor according to some embodiments.

Referring to FIG. 13, an image sensor 100i may have a stacked-chip structure, in which a first sub-chip CH1, a second sub-chip CH2, and a third sub-chip CH3 are sequentially stacked on top of another and are bonded to each other. In an embodiment, the first sub-chip CH1 may be configured to have an image sensing function. The first sub-chip CH1 may be configured to have the same or similar features as those described with reference to FIGS. 1 to 11.

The first sub-chip CH1 may include transfer gates TG, which are formed on a front surface 1a of the first substrate 1, and first interlayer insulating layers IL1 covering the transfer gates TG. The first substrate 1 may include a pixel array region APS and an edge region EG. The pixel array region APS may include a plurality of unit pixels PX. The edge region EG may correspond to a portion of the optical black region OB of FIG. 12.

A first device isolation portion STI1 may be disposed in the first substrate 1 to define active regions. A device isolation portion DTI may be disposed in the first substrate 1 to isolate or delimit the unit pixels PX in the pixel array region APS. The device isolation portion DTI may be extended to the edge region EG. The device isolation portion DTI may include an insulating gapfill pattern 12, an insulating isolation pattern 16, and a conductive isolation pattern 14. The insulating gapfill pattern 12 may be interposed between the conductive isolation pattern 14 and the first interlayer insulating layer IL1. The insulating isolation pattern 16 may be interposed between the conductive isolation pattern 14 and the first substrate 1 and between the insulating gapfill pattern 12 and the first substrate 1.

The front surface 1a of the first substrate 1 may be covered with the first interlayer insulating layers IL1. First interconnection lines 15 may be disposed between or in the first interlayer insulating layers IL1. A floating diffusion region FD may be connected to the first interconnection line 15 through a first contact plug 17. A first conductive pad CP1 may be disposed in the lowermost one of the first interlayer insulating layers IL1. The first conductive pad CP1 may be formed of or include copper.

In the edge region EG, a connection contact BCA may be provided to penetrate a first protection layer 44, a fixed charge layer 24, and a portion of the first substrate 1 and be in contact with the conductive isolation pattern 14. The connection contact BCA may be placed in a third trench 46. The connection contact BCA may include a diffusion prevention pattern 48g conformally covering an inner side surface and a bottom surface of the third trench 46, a first metal pattern 52 on the diffusion prevention pattern 48g, and a second metal pattern 54 filling the third trench 46. The diffusion prevention pattern 48g may be formed of or include, for example, titanium. The first metal pattern 52 may be formed of or include, for example, tungsten. The second metal pattern 54 may be formed of or include, for example, aluminum. The diffusion prevention pattern 48g and the first metal pattern 52 may be extended to a region on the first protection layer 44 and may be electrically connected to other interconnection lines or via/contact plugs.

A second protection layer 56 may be stacked on the first protection layer 44. The second protection layer 56 may be provided to conformally cover a light-blocking pattern 48a, a low refractive pattern 50a, and the connection contact BCA.

In the edge region EG, a first optical black pattern CFB may be disposed on the second protection layer 56. For example, the first optical black pattern CFB may be formed of or include the same material as a blue color filter.

In the edge region EG, a residual lens layer MLR may be disposed on the first optical black pattern CFB. The residual lens layer MLR may be formed of or include the same material as the micro lenses ML.

The second sub-chip CH2 may include a second substrate SB2, selection gates SEL, source follower gates SF, and reset gates (not shown), which are disposed on the second substrate SB2, and second interlayer insulating layers IL2 covering them. A second device isolation portion STI2 may be disposed in the second substrate SB2 to define active regions. Second contacts 217 and second interconnection lines 215 may be disposed in the second interlayer insulating layers IL2. A second conductive pad CP2 may be disposed in the uppermost one of the second interlayer insulating layers IL2. The second conductive pad CP2 may be formed of or include copper. The second conductive pad CP2 may be in contact with the first conductive pad CP1. The source follower gates SF may be respectively connected to the floating diffusion regions FD of the first sub-chip CH1.

The third sub-chip CH3 may include a third substrate SB3, peripheral transistors PTR disposed on the third substrate SB3, and third interlayer insulating layers IL3 covering them. A third device isolation portion STI3 may be disposed in the third substrate SB3 to define active regions. Third contacts 317 and third interconnection lines 315 may be disposed in the third interlayer insulating layers IL3. The uppermost one of the third interlayer insulating layers IL3 may be in contact with the second substrate SB2. A penetration electrode TSV may be provided to penetrate the second interlayer insulating layer IL2, the second device isolation portion STI2, the second substrate SB2, and the third interlayer insulating layer IL3 and to connect the second interconnection line 215 to the third interconnection line 315. A sidewall of the penetration electrode TSV may be enclosed by a via insulating layer TVL. The third sub-chip CH3 may include circuits, which are used to drive the first and/or second sub-chip CH1 and/or CH2 or to store electrical signals that are generated by the first and/or second sub-chip CH1 and/or CH2.

In an image sensor according to various embodiments, capacitors with different electrostatic capacitances may be disposed on one pixel. In this case, it may be possible to realize a high-quality image with an improved HDR property and to increase an integration density of pixels.

While example embodiments have been particularly shown and described, it will be understood by one of ordinary skill in the art that variations in form and detail may be made therein without departing from the spirit and scope of the attached claims. The embodiments described with reference to FIGS. 1 to 13 may be combined to realize additional embodiments within the scope of the appended claims.

What is claimed is:

1. An image sensor comprising:
   a substrate including a plurality of pixels;
   a first transistor and a second transistor disposed on the substrate, the first transistor spaced apart on the substrate from the second transistor;
   a first interlayer insulating layer covering the first transistor and the second transistor;
   a first lower electrode disposed in the first interlayer insulating layer and connected to an end portion of the first transistor;
   a first dielectric layer on the first lower electrode;
   a first upper electrode on the first dielectric layer;
   a second interlayer insulating layer covering the first upper electrode and the first interlayer insulating layer;
   a first pillar provided to penetrate the second interlayer insulating layer and the first interlayer insulating layer, the first pillar being connected to an end portion of the second transistor;
   a third transistor and a fourth transistor disposed on the substrate, the third transistor spaced apart on the substrate from the fourth transistor;
   a third capacitor connected to an end portion of the third transistor; and
   a fourth capacitor connected to an end portion of the fourth transistor,
   wherein a capacitance of the third capacitor is different from a capacitance of the fourth capacitor, and
   wherein the first dielectric layer comprises a material different from a material of the first interlayer insulating layer.

2. The image sensor of claim 1, further comprising:
   a second lower electrode on the first pillar;
   a second dielectric layer on the second lower electrode; and
   a second upper electrode on the second dielectric layer.

3. The image sensor of claim 1, wherein the first lower electrode comprises a plurality of first lower electrodes, each having a cup shape, and
   a portion of the first dielectric layer and a first portion of the first upper electrode extend into the plurality of first lower electrodes.

4. The image sensor of claim 3, further comprising a first conductive pattern connecting bottom surfaces of the plurality of first lower electrodes.

5. The image sensor of claim 3, wherein a second portion of the first upper electrode is disposed in a space between the plurality of first lower electrodes.

6. The image sensor of claim 1, further comprising a device isolation portion disposed in the substrate to separate the plurality of pixels from each other, wherein the first upper electrode vertically overlaps the device isolation portion.

7. The image sensor of claim 1, wherein the first lower electrode is provided in plural, each of the plurality of first lower electrodes has a pillar shape, and a portion of the first dielectric layer and a portion of the first upper electrode extend into a region between the plurality of first lower electrodes.

8. The image sensor of claim 1, further comprising:

a transfer gate disposed on the substrate;

a floating diffusion region beside the transfer gate;

a first source follower gate connected to the floating diffusion region and disposed on the substrate; and a first impurity region beside the first source follower gate, wherein an opposite end portion of the first transistor that is opposite to the end portion of the first transistor connected to the first lower electrode and an opposite end portion of the second transistor that is opposite to the end portion of the second transistor that is connected to the first pillar are connected to the first impurity region.

9. An image sensor comprising:

a substrate including a plurality of pixels;

a transfer gate disposed on the substrate;

a floating diffusion region beside the transfer gate;

a first source follower gate connected to the floating diffusion region and disposed on the substrate;

a first impurity region beside the first source follower gate;

a first transistor connected to the first impurity region and a second transistor connected to the first impurity region;

a first capacitor connected to an end portion of the first transistor;

a second capacitor connected to an end portion of the second transistor;

a third transistor and a fourth transistor disposed on the substrate, the third transistor spaced apart on the substrate from the fourth transistor;

a third capacitor connected to an end portion of the third transistor; and a fourth capacitor connected to an end portion of the fourth transistor, wherein a capacitance of the third capacitor is different from a capacitance of the fourth capacitor, and wherein, when viewed in a plan view, an area of the second capacitor is different from an area of the first capacitor.

10. The image sensor of claim 9, further comprising a first interlayer insulating layer and a second interlayer insulating layer, which are sequentially stacked to cover the first transistor and the second transistor, wherein the first capacitor comprises:

a first lower electrode disposed in the first interlayer insulating layer;

a first dielectric layer on the first lower electrode; and a first upper electrode located on the first dielectric layer and covered with the second interlayer insulating layer, wherein the second capacitor comprises a first pillar penetrating the first interlayer insulating layer and the second interlayer insulating layer, and wherein the first dielectric layer comprises a material different from a material of the first interlayer insulating layer and from a material of the second interlayer insulating layer.

11. The image sensor of claim 10, further comprising:

a second lower electrode on the first pillar;

a second dielectric layer on the second lower electrode; and a second upper electrode on the second dielectric layer.

12. The image sensor of claim 10, wherein the first lower electrode is provided in plural, each of the plurality of first lower electrodes has a cup shape, and a portion of the first dielectric layer and a first portion of the first upper electrode extend into the plurality of first lower electrodes.

13. The image sensor of claim 12, wherein a second portion of the first upper electrode extends into a space between the plurality of first lower electrodes.

14. The image sensor of claim 10, further comprising a device isolation portion disposed in the substrate to separate the plurality of pixels from each other, wherein the plurality of pixels comprise a first pixel and a second pixel, the first pixel has an octagonal shape and has a first width, when viewed in a plan view, the second pixel has a tetragonal shape and has a second width, when viewed in a plan view, the second width being less than the first width, and the first upper electrode vertically overlaps the device isolation portion, between the first pixel and the second pixel.

15. The image sensor of claim 10, wherein the first lower electrode is provided in plural, each of the plurality of first lower electrodes has a pillar shape, and a portion of the first dielectric layer and a portion of the first upper electrode extend into a region between the plurality of first lower electrodes.

16. An image sensor comprising:

a substrate including a plurality of pixels;

a device isolation portion disposed in the substrate to separate the plurality of pixels from each other;

a transfer gate disposed on the substrate and in each of the plurality of pixels;

a floating diffusion region beside the transfer gate;

a first source follower gate connected to the floating diffusion region and disposed on the substrate;

a first impurity region beside the first source follower gate;

a first transistor, a second transistor, a third transistor, and a fourth transistor, each connected to the first impurity region;

a first interlayer insulating layer covering the substrate, the first transistor, the second transistor, the third transistor, and the fourth transistor;

a first capacitor connected to an end portion of the first transistor;

a second capacitor connected to an end portion of the second transistor;

a third capacitor connected to an end portion of the third transistor; and a fourth capacitor connected to an end portion of the fourth transistor, wherein the first capacitor, the second capacitor, the third capacitor and the fourth capacitor are located on the first interlayer insulating layer, a first one of the first capacitor, the second capacitor, the third capacitor and the fourth capacitor has a first capacitance, a second one of the first capacitor, the second capacitor, the third capacitor and the fourth capacitor has a second capacitance, and the first capacitance is 10 to $10^{10}$ times the second capacitance.

17. The image sensor of claim 16, further comprising a second interlayer insulating layer covering the first capacitor, wherein the first one of the first capacitor, the second capacitor, the third capacitor and the fourth capacitor comprises:

a first conductive pattern;

a plurality of first lower electrodes on the first conductive pattern;

a first dielectric layer on the plurality of first lower electrodes; and a first upper electrode on the first dielectric layer, wherein the first upper electrode is covered with the second interlayer insulating layer, and wherein the second one of the first capacitor, the second capacitor, the third capacitor and the fourth capacitor comprises a first pillar penetrating the first interlayer insulating layer and the second interlayer insulating layer.

18. The image sensor of claim 17, wherein the second one of the first capacitor, the second capacitor, the third capacitor and the fourth capacitor further comprises:

a second lower electrode on the first pillar;

a second dielectric layer on the second lower electrode; and a second upper electrode on the second dielectric layer.

\* \* \* \* \*